United States Patent
Anderson et al.

(10) Patent No.: US 7,741,672 B2
(45) Date of Patent: Jun. 22, 2010

(54) BRIDGED GATE FINFET

(75) Inventors: Brent A. Anderson, Hericho, VT (US); Andres Bryant, Burlington Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 11/933,571

(22) Filed: Nov. 1, 2007

(65) Prior Publication Data

US 2009/0140328 A1 Jun. 4, 2009

(51) Int. Cl.
*H01L 29/94* (2006.01)
*H01L 21/20* (2006.01)

(52) U.S. Cl. ............................. 257/308; 438/399
(58) Field of Classification Search ......... 257/306–308, 257/E21.646–E21.66, E27.084–E27.097; 438/396, 399
See application file for complete search history.

(56) References Cited

U.S. PATENT DOCUMENTS

| 6,432,829 | B2 * | 8/2002 | Muller et al. ............... 438/694 |
| 7,288,805 | B2 * | 10/2007 | Anderson et al. ........... 257/250 |
| 2009/0101978 | A1 * | 4/2009 | Anderson et al. ........... 257/365 |

* cited by examiner

*Primary Examiner*—Calvin Lee
(74) *Attorney, Agent, or Firm*—Gibb I.P. Law Firm, LLC

(57) ABSTRACT

In a fin-type field effect transistor (FinFET) structure, a gate strap is positioned on the top of a gate conductor and runs along the gate conductor. The top of the gate strap is positioned a greater height above the top surface of the substrate than the top of the fin cap. The gate strap is conformal and, therefore, the top of the portion of the gate strap that crosses the fin cap has a greater height above the top surface of the substrate than top portions of other regions of the gate strap. Further, the material of the gate strap can have a different work function than a material of the gate conductor.

6 Claims, 2 Drawing Sheets

US 7,741,672 B2

BRIDGED GATE FINFET

BACKGROUND AND SUMMARY

The embodiments of the invention generally relate to transistor structures and more particularly to fin-type field effect transistors (FinFET) that utilize gate straps above the gate conductors.

Within FinFETs and other similar structures, fin edge capacitance and corner parasitic reactions can degrade performance of the FinFET Technology. In order to address such issues, the present invention is directed to a semiconductor structure, which includes FinFET devices having a gate strapping plug between adjacent fins, recessed below the top of a cap on the fins. This structure reduces the outer fringe capacitance. More specifically, with embodiments herein, the fin-type field effect transistor (FinFET) structure begins with a substrate and a fin having a bottom positioned on the top surface of the substrate. The fin has a "fin length" running parallel to the top surface of the substrate, a "fin height" above the top surface of the substrate that is less than the fin length, and a "fin width" running parallel to the top surface of the substrate and running perpendicular to the fin length.

The fin is a relatively narrow width, relatively tall height structure that protrudes from the top surface of the substrate. Therefore, the fin width is less than the fin height. A fin cap is positioned on the top of the fin and runs along the fin. The fin cap has a fin cap width equal to the fin width, and fin cap height that is less than the fin height.

A gate conductor is positioned on the top surface of the substrate. The gate conductor has a "gate conductor length" running parallel to the top of the substrate that is perpendicular to the fin length such that the gate conductor intersects the fin. The gate conductor has a gate conductor height above the top surface of the substrate that is greater than the fin height, yet that is less than the height that the top of fin cap is positioned above the top surface of the substrate.

A gate strap is positioned on the top of the gate conductor and runs along the gate conductor. The gate strap has a "gate strap width" equal to the gate conductor width. The top of the gate strap is positioned a greater height above the top surface of the substrate than the top of the fin cap. The top of the portion of the gate strap that crosses the fin cap has a greater height above the top surface of the substrate than top portions of other regions of the gate strap. Further, the material of the gate strap can have a different work function than a material of the gate conductor.

As with conventional FinFET structures, an insulator (e.g., gate oxide) separates the gate conductor and the gate strap from the fin and the fin cap. Further, the region of the fin that is positioned below the gate conductor comprises a semiconductor. Further, the FinFET structure can include multiple fins and fin caps, in which case the gate conductor would fill in the space between the gate conductors and comprise a gateplug.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
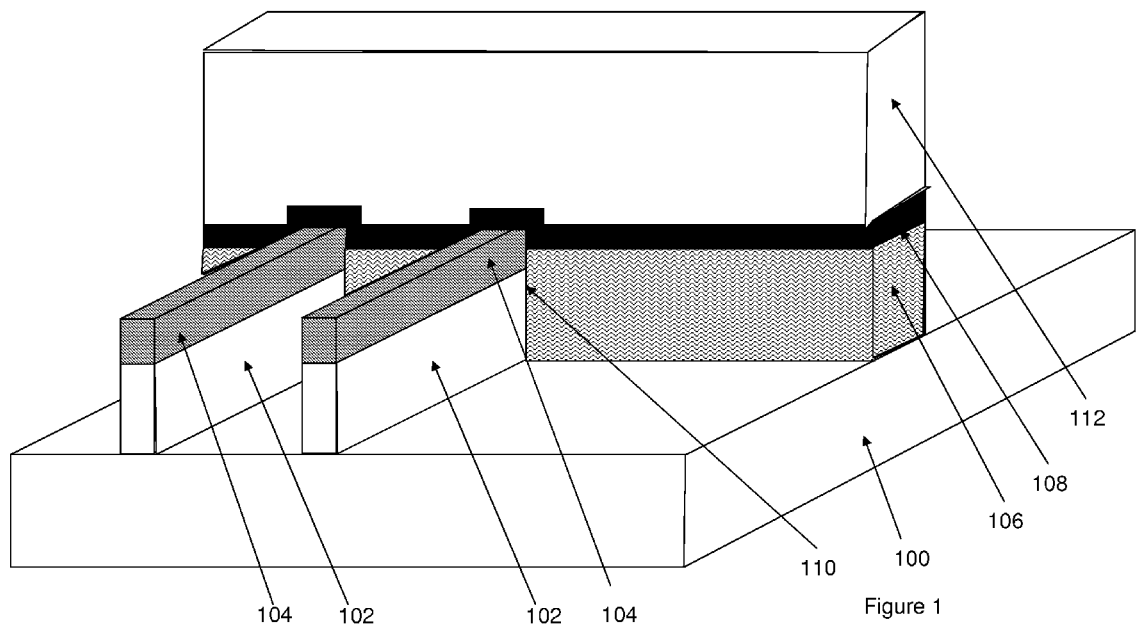
FIG. 1 is a schematic perspective-view diagram of a transistor according to embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, the embodiments of the invention generally relate to transistor structures and more particularly to fin-type field effect transistors (FinFET) that utilize gate straps above the gate conductors. While FinFETs provide many substantial benefits when compared to planar transistors, fin edge capacitance and corner parasitic reactions can degrade performance of the FinFET Technology.

In order to address such issues, the present invention is directed to a semiconductor structure, which includes FinFET devices having a gate strapping plug between adjacent fins, recessed below the top of a cap on the fins. This structure reduces the outer fringe capacitance.

Figure 2:
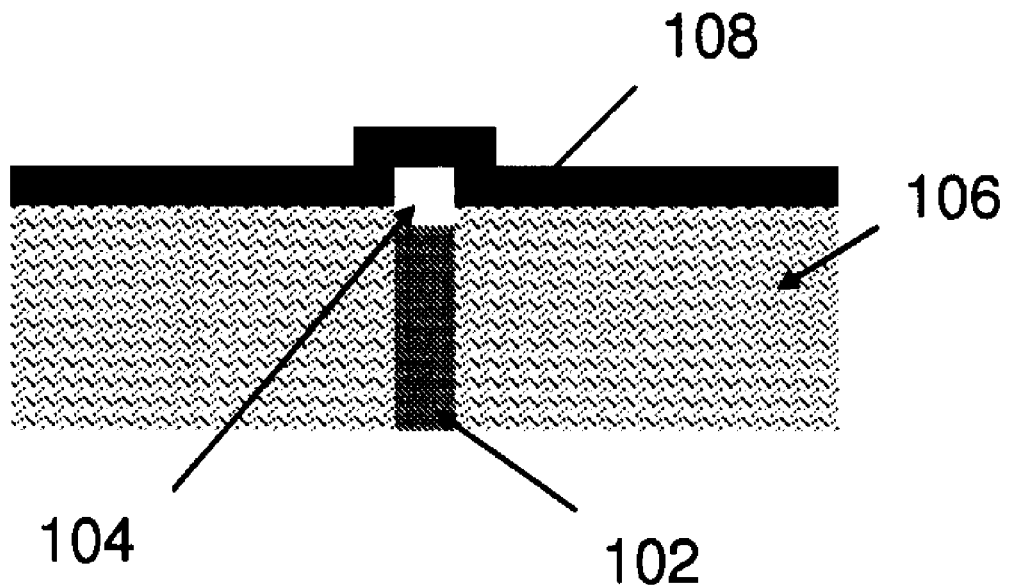
FIG. 2 is a schematic cross-sectional diagram of a transistor according to embodiments herein.
Figure 3:
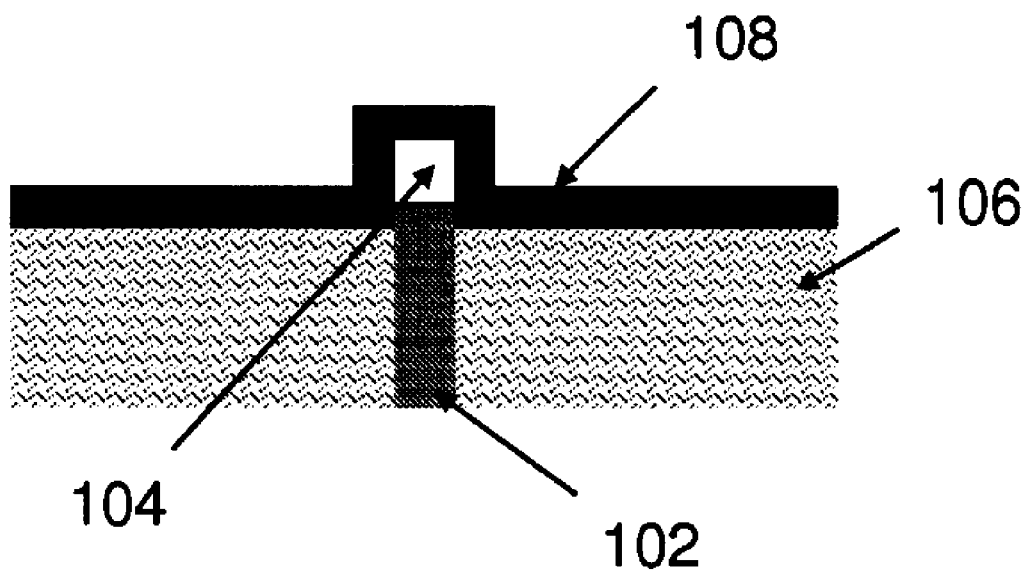
FIG. 3 is a schematic cross-sectional diagram of a transistor according to embodiments herein.

As shown in perspective view in FIG. 1 and in cross-sectional view in FIGS. 2 and 3, with embodiments herein, the fin-type field effect transistor (FinFET) structure begins with a substrate 100 and one or more fins 102 that are patterned on the top surface of the substrate 100. Each fin 102 has the same "fin length" running parallel to the top surface of the substrate 100, the same "fin height" above the top surface of the substrate 100 that is less than the fin length, and the same "fin width" running parallel to the top surface of the substrate 100 and running perpendicular to the fin length.

As shown in FIGS. 1-3, the fin 102 is a relatively narrow width, relatively tall height structure that protrudes from the top surface of the substrate 100. Therefore, the fin 102 width is less than the fin height. A fin cap 104 is then patterned on the top of each fin 102 and runs along the fin 102. The fin cap 104 has a fin cap 104 width equal to the fin width, and fin cap height that is less than the fin height.

A gate conductor 106 (e.g., polysilicon) is then patterned on the top surface of the substrate 100. The gate conductor 106 has a "gate conductor length" running parallel to the top of the substrate 100. The gate conductor's length is approximately perpendicular to the fin's length because the gate conductor 106 intersects the fin 102. As shown most clearly in FIG. 2, the gate conductor 106 has a gate conductor 106 height above the top surface of the substrate 100 that is greater than the fin height, yet that is less than the height that the top of fin cap 104 is positioned above the top surface of the substrate 100.

A conformal gate strap 108 (e.g., polysilicon) is then formed on the top of the gate conductor 106 so that it runs along the gate conductor 106. The gate strap 108 has a "gate strap width" equal to the gate conductor 106 width. As shown most clearly in FIG. 2, the top of the gate strap 108 is positioned a greater height above the top surface of the substrate 100 than the top of the fin cap 104.

The gate strap 108 is conformal and, therefore, as shown most clearly in FIG. 1, the top of the portion of the gate strap 108 that crosses the fin cap 104 has a greater height above the top surface of the substrate 100 than top portions of other regions of the gate strap 108. Further, the material of the gate strap 108 can have a different work function than a material of the gate conductor 106 (through various different doping schemes, etc.) allowing the transistor to be tuned to different needs.

As with conventional FinFET structures, an insulator 110 (e.g., gate oxide) separates the gate conductor 106 and the gate strap 108 from the fin 102 and the fin cap 104. Also, an insulator 112 (e.g., nitride) is formed over the gate. Further, the region of the fin 102 that is positioned below the gate conductor 106 comprises a semiconductor (channel region) and the ends of the fin comprise the source and drain regions of the transistor. Further, the FinFET structure can include multiple fins and fin cap 104s as shown in FIG. 1, in which case the gate conductor 106 would fill in the space between the gate conductor 106s. Other remaining structures including contacts, wiring, insulators are then formed to protect the transistor and allow the transistor to communicate with other devices.

In the embodiment shown in FIG. 2 the transition (border) between the gate conductor 106 and the gate strap 108 is positioned above (relative to the underlying substrate) the transition (border) between the fin 102 and the fin cap 104. To the contrary, in the embodiment shown in FIG. 3, the transition between the gate conductor 106 and the gate strap 108 is positioned below (relative to the underlying substrate) the transition between the fin 102 and the fin cap 104, such that the vertical portion of the gate strap 108 is longer that the vertical portion of the fin cap 104. This allows the gate strap 108 to cover the upper corners of the fin 102. When a different work function is used in the gate strap 108 than is used in the gate conductor 106, the parasitic reactions that occur at the upper corners of the fin 102 ("corner parasitics") are substantially reduced or eliminated. Therefore, not only does the gate strap 108 reduce the capacitance of the gate conductor 106, if the gate strap 108 is positioned to cover the upper corners of the fin 102 (those corners that border the lower portion of the fin cap 104) and provided with a unique work function, the corner parasitics can also be eliminated.

Thus, as shown above, the present invention provides FinFET devices having a gate strapping plug between adjacent fins, recessed below the top of a cap on the fins. This structure reduces the outer fringe capacitance. Further, to allow the structure flexibility, the thin film strap on the plug can have a different workfunction than the plug to also reduce corner parasitics.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A fin-type field effect transistor (FinFET) structure comprising:
   a substrate having a top surface;
   a fin having a bottom positioned on said top surface of said substrate, wherein said fin protrudes from said top surface of said substrate, and wherein said fin has a fin length running parallel to said top surface of said substrate, a fin height above said top surface of said substrate that is less than said fin length, and a fin width running parallel to said top surface of said substrate and running perpendicular to said fin length, wherein said fin width is less than said fin height;
   a fin cap positioned on a top of said fin and running along said fin, wherein said fin cap has a fin cap width equal to said fin width, and fin cap height that is less than said fin height;
   a gate conductor having a bottom positioned on said top surface of said substrate, wherein said gate conductor has a gate conductor length running parallel to said top of said substrate that is perpendicular to said fin length such that said gate conductor intersects said fin, wherein said gate conductor has a gate conductor height above said top surface of said substrate that is greater than said fin height and less than a height that a top of fin cap is positioned above said top surface of said substrate;
   a gate strap positioned on a top of said gate conductor and running along said gate conductor, wherein said gate strap has a gate strap width equal to said gate conductor width, and wherein a top of said gate strap is positioned a greater height above said top surface of said substrate than said top of said fin cap; and
   an insulator separating said gate conductor and said gate strap from said fin and said fin cap;
   wherein a region of said fin that is positioned below said gate conductor comprises a semiconductor.

2. The FinFET structure according to claim 1, all the limitations of which are incorporated herein by reference, wherein a top of a portion of said gate strap that crosses said fin cap has a greater height above said top surface of said substrate than top portions of other regions of said gate strap.

3. The FinFET structure according to claim 1, all the limitations of which are incorporated herein by reference, wherein said FinFET structure comprises multiple ones of said fin and said fin cap.

4. A fin-type field effect transistor (FinFET) structure comprising:
   a substrate having a top surface;
   a fin having a bottom positioned on said top surface of said substrate, wherein said fin protrudes from said top surface of said substrate, and wherein said fin has a fin length running parallel to said top surface of said substrate, a fin height above said top surface of said substrate that is less than said fin length, and a fin width running parallel to said top surface of said substrate and running perpendicular to said fin length, wherein said fin width is less than said fin height;

a fin cap positioned on a top of said fin and running along said fin, wherein said fin cap has a fin cap width equal to said fin width, and fin cap height that is less than said fin height;

a gate conductor having a bottom positioned on said top surface of said substrate, wherein said gate conductor has a gate conductor length running parallel to said top of said substrate that is perpendicular to said fin length such that said gate conductor intersects said fin, wherein said gate conductor has a gate conductor height above said top surface of said substrate that is less than said fin height;

a gate strap positioned on a top of said gate conductor and running along said gate conductor, wherein said gate strap has a gate strap width equal to said gate conductor width, wherein a top of said gate strap is positioned a greater height above said top surface of said substrate than said top of said fin cap, and wherein a material of said gate strap has a different work function than a material of said gate conductor; and an insulator separating said gate conductor and said gate strap from said fin and said fin cap;

wherein a region of said fin that is positioned below said gate conductor comprises a semiconductor.

5. The FinFET structure according to claim 4, all the limitations of which are incorporated herein by reference, wherein a top of a portion of said gate strap that crosses said fin cap has a greater height above said top surface of said substrate than top portions of other regions of said gate strap.

6. The FinFET structure according to claim 4, all the limitations of which are incorporated herein by reference, wherein said FinFET structure comprises multiple ones of said fin and said fin cap.

* * * * *